(12) United States Patent
Brobston et al.

(10) Patent No.: US 7,671,693 B2
(45) Date of Patent: Mar. 2, 2010

(54) SYSTEM AND METHOD FOR A TUNABLE IMPEDANCE MATCHING NETWORK

(75) Inventors: Michael Brobston, Allen, TX (US); Xu Zhu, Plano, TX (US); Seong Eun Kim, Plano, TX (US)

(73) Assignee: Samsung Electronics Co., Ltd., Suwon-si (KR)

( * ) Notice: Subject to any disclaimer, the term of this patent is extended or adjusted under 35 U.S.C. 154(b) by 660 days.

(21) Appl. No.: 11/404,734

(22) Filed: Apr. 14, 2006

(65) Prior Publication Data

US 2007/0194859 A1    Aug. 23, 2007

Related U.S. Application Data

(60) Provisional application No. 60/774,324, filed on Feb. 17, 2006.

(51) Int. Cl.
H03H 7/38    (2006.01)
(52) U.S. Cl. .................................. 333/17.3; 333/32
(58) Field of Classification Search ............... 333/32, 333/33, 17.3
See application file for complete search history.

(56) References Cited

U.S. PATENT DOCUMENTS

| | | | |
|---|---|---|---|
| 5,923,297 A | 7/1999 | Kim et al. | |
| 6,526,263 B1 | 2/2003 | Saito | |
| 6,621,378 B2 * | 9/2003 | Naruse et al. ................ | 333/185 |
| 6,646,525 B2 | 11/2003 | Bozler et al. | |
| 6,670,864 B2 * | 12/2003 | Hyvonen et al. ............... | 333/32 |
| 6,738,603 B1 | 5/2004 | Saito | |
| 6,746,891 B2 | 6/2004 | Cunningham et al. | |
| 6,847,114 B2 | 1/2005 | Sett et al. | |
| 6,862,432 B1 | 3/2005 | Kim | |
| 6,876,047 B2 | 4/2005 | Cunningham et al. | |
| 6,876,482 B2 | 4/2005 | DeReus | |
| 6,882,264 B2 | 4/2005 | Cunningham | |
| 6,897,537 B2 | 5/2005 | de los Santos | |
| 6,917,086 B2 | 7/2005 | Cunningham et al. | |
| 7,603,150 B2 * | 10/2009 | Takahashi ................ | 455/575.3 |
| 2002/0030566 A1 | 3/2002 | Bozler et al. | |
| 2002/0086456 A1 | 7/2002 | Cunningham et al. | |
| 2002/0104990 A1 | 8/2002 | DeReus et al. | |
| 2002/0113281 A1 | 8/2002 | Cunningham et al. | |
| 2002/0118075 A1 | 8/2002 | Ohwada et al. | |
| 2002/0145483 A1 * | 10/2002 | Bouisse ..................... | 333/17.3 |
| 2002/0181838 A1 | 12/2002 | Cunningham et al. | |
| 2003/0021004 A1 | 1/2003 | Cunningham et al. | |
| 2003/0116848 A1 | 6/2003 | Cunningham et al. | |
| 2003/0116851 A1 | 6/2003 | Sett et al. | |
| 2003/0117257 A1 | 6/2003 | Cunningham | |
| 2003/0119221 A1 | 6/2003 | Cunningham et al. | |
| 2004/0009754 A1 | 1/2004 | Smith, Jr. | |
| 2004/0012298 A1 | 1/2004 | Cunningham et al. | |
| 2004/0036558 A1 | 2/2004 | Allison et al. | |
| 2004/0100341 A1 * | 5/2004 | Luetzelschwab et al. ...... | 333/32 |
| 2004/0188785 A1 | 9/2004 | Cunningham et al. | |
| 2004/0197960 A1 | 10/2004 | Sett et al. | |

(Continued)

Primary Examiner—Stephen E Jones

(57) ABSTRACT

The present disclosure relates generally to tunable impedance matching networks and methods for the use of such networks. In one example, a method includes identifying state information about a mobile device, accessing a memory to identify a configuration of an impedance matching network based on the state information, and applying the values from the configuration to the impedance matching network.

26 Claims, 4 Drawing Sheets

U.S. PATENT DOCUMENTS

2005/0007291 A1 1/2005 Fabrega-Sanchez et al.
2005/0057399 A1 3/2005 Kipnis et al.
2005/0130699 A1 6/2005 Kim

* cited by examiner

SYSTEM AND METHOD FOR A TUNABLE IMPEDANCE MATCHING NETWORK

CROSS REFERENCE

This application claims priority to U.S. Provisional Patent Ser. No. 60/774,324, entitled "METHOD FOR TUNABLE MATCHING NETWORK CONTROL", filed on Feb. 17, 2006, which is hereby incorporated by reference in its entirety.

This application is related to U.S. patent application Ser. No. 11/232,663, entitled "SYSTEM AND METHOD FOR A DIGITALLY TUNABLE IMPEDANCE MATCHING NETWORK", filed on Sep. 22, 2005, which is hereby incorporated by reference in its entirety.

BACKGROUND

Impedance matching is used to match the impedance of a source with the impedance of a load circuit. As is known, matching the impedance of the source and load enables the maximum amount of power to be transferred from the source to the load for a given signal. However, antenna impedance matching presents particular difficulties in mobile devices, such as mobile handsets, due to the constantly changing environment in which such devices may operate. The changing environment can result in large changes in the antenna impedance that cause a fixed matching network to be ineffective in providing an optimum impedance match between the antenna and the front end circuitry of the mobile device.

Therefore, what is needed is a new and improved system for impedance matching in a mobile device and a method for using such a system.

SUMMARY

In one embodiment, a system is provided that comprises signaling circuitry, impedance matching circuitry, a memory, and a controller. The signaling circuitry is coupled to an antenna and configured to receive a signal at a first frequency and transmit a signal at a second frequency. The impedance matching circuitry is coupled to the signaling circuitry and has a plurality of tunable elements for matching an impedance of the first and second frequencies with an impedance of the antenna. The memory contains a plurality of values associated with the tunable elements, where each value corresponds to a state of the signaling circuitry and is defined to configure the associated tunable element for impedance matching at both the first and second frequencies when the signaling circuitry is in the corresponding state. The controller is configured to obtain a current state of the signaling circuitry, select the values from the memory that correspond to the current state, and apply the selected values to their associated tunable elements.

In another embodiment, a circuit for use in a tunable matching network based on a pi network topology is provided. The circuit comprises a first reactive series section coupled to an input line and a second reactive series section coupled to an antenna via an output line and coupled in series to the first reactive series section. The first reactive series section has a first variable capacitor and a first fixed inductor coupled in parallel to the first variable capacitor, and the second reactive series section has a second variable capacitor and a second fixed inductor coupled in parallel to the second variable capacitor. The circuit also includes a third variable capacitor coupled between ground and the input line and first reactive series section, and a fourth variable capacitor coupled between ground and the output line and second reactive series section.

In yet another embodiment, a look-up table for use by a controller in setting an impedance matching network in a mobile device is provided. The look-up table comprises an index having a plurality of mobile device states, and a plurality of configurations. Each configuration is associated with a particular mobile device state and contains pre-defined values for setting a plurality of tunable elements of the impedance matching network to simultaneously match a first frequency and a second frequency.

In still another embodiment, a method for impedance matching in a mobile device is provided. The method comprises identifying state information about the mobile device and accessing a memory to identify a configuration of an impedance matching network based on the state information. The configuration includes values for simultaneously matching an impedance of transmitting circuitry operating at a first frequency with an impedance of an antenna and matching an impedance of receiving circuitry operating at a second frequency with an impedance of the antenna. The method also includes applying the values from the configuration to the impedance matching network.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
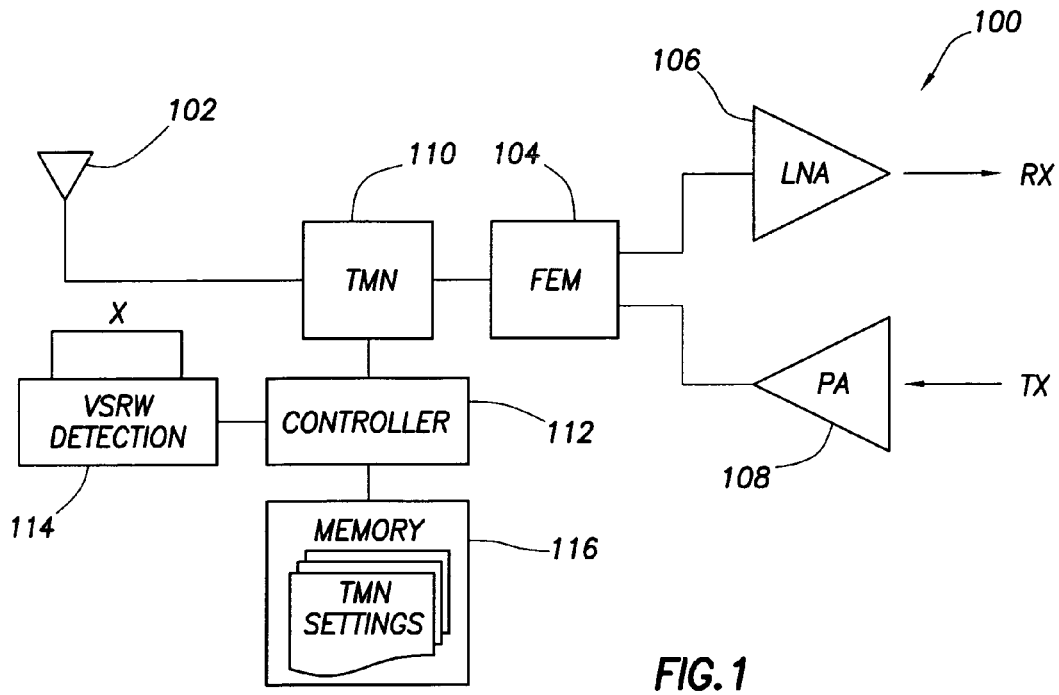
FIG. 1 is a diagram of one embodiment of a system containing a tunable matching network for matching the impedance of various components.

It is to be understood that the following disclosure provides many different embodiments, or examples, for implementing different features of the disclosure. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Referring to FIG. 1, in one embodiment, a system 100 is configured to provide for the transmission and reception of information via an antenna 102. For example, the system 100 may be integrated into a mobile device such as a mobile handset (e.g., a cell phone) capable of transmitting voice and/or data in a wireless network utilizing a technology such as Code Division Multiple Access (CDMA), Global System for Mobile communication (GSM), Orthogonal Frequency Division Multiplexing (OFDM), or other communications technologies.

In addition to the antenna 102, the system 100 includes a front-end module (FEM) 104, a low noise amplifier (LNA) 106, and a power amplifier (PA) 108. The antenna 102, FEM 104, and LNA 106 are coupled to form circuitry for a reception channel whereby data and voice communications received via the antenna 102 are directed to other circuitry (not shown) within the system 100. Similarly, the PA 108, FEM 104, and antenna 102 are coupled to form circuitry for a transmission channel whereby data and voice communications are sent from other circuitry (not shown) within the system 100 for transmission via the antenna 102.

In some environments, such as a cell phone handset, the system 100 is generally designed to have its radio frequency (RF) transmit/receive impedance match the impedance of the antenna 102 based on a non-reflective environment. In most realistic handset environments the RF impedance may change over time and may vary greatly from that of the non-reflective environment due to factors such as the location of walls, ceilings, or other reflective objects, whether the handset is placed close to the head, the location of the user's fingers relative to the antenna 102, and whether the handset is a flip phone or a slider phone that is closed. Such conditions, which can affect handset performance and quality of communication, may be viewed in terms of their impact on the voltage standing wave ratio (VSWR), which measures the efficiency of the transfer of energy into an antenna system in terms of the energy that is projected by the system and the energy reflected back from the antenna.

A poor VSWR at the antenna interface will cause a loss of power or mismatch loss at the interface of the antenna to the radio front-end circuitry. In addition, a poor VSWR is associated with performance degradation in the handset due to the impedance mismatch between the FEM 104, LNA 106, and PA 108. For example, a change in source or load impedance seen by a duplexer within the FEM 104 can cause power loss and detune the duplexer response. A source impedance mismatch from the antenna 102 as seen by the LNA 106 can result in noise figure degradation in the LNA, which may result in sensitivity degradation. Likewise, load impedance variation seen by the PA 108 can result in power loss and linearity degradation. Degradation in linearity in the PA 108 may result in a degraded adjacent channel power ratio (ACPR), which may cause the handset to fail to comply with various regulatory agency or standards requirements.

Generally, a fixed antenna matching network is unable to adapt and provide sufficient impedance matching of the antenna 102 into the radio front-end components such as the FEM 104, LNA 106, and PA 108. One solution to this problem is the use of a tunable impedance matching network (TMN). Generally, such a solution relies on detecting the impedance, return loss, or VSWR of the antenna 102 and then using this information to control the matching network circuitry to provide an improvement in the impedance transformation between the antenna and the FEM 104. For example, the VSWR may be determined by detecting the transmit carrier reflection using an available reference signal.

This approach may be effective with respect to time division duplex (TDD) systems in which transmit and receive carriers are set at the same radio frequencies. More specifically, the TMN values may be determined based on the transmit carrier reflection and the same values may also be used to optimize the receive carrier reception at the same frequency. However, many wireless communication systems, including GSM, CDMA, and WCDMA, operate in a frequency division duplex (FDD) mode at the mobile terminal. In an FDD system, the receive frequency is generally offset from the transmit frequency at the mobile terminal by between about 45 MHz to 190 MHz for commonly used frequency allocations worldwide. If the antenna impedance of the mobile terminal is not significantly different at the transmit frequency than at the receive frequency, then the above described method based on tuning the TMN based solely on the detected transmit carrier reflection and closed loop control of the TMN may be used.

However, the antenna impedance in an FDD environment is often significantly different in both magnitude and phase at the receive carrier frequency and the transmit carrier frequency. Moreover, because the impedances seen at both frequencies can change significantly with changes in the spatial environment, it is difficult to effectively match the transmit and receive impedances based solely on detection of the antenna impedance at the transmit carrier frequency in a closed loop control system that merely attempts to minimize the reflected transmit carrier power. A closed control loop that detects the transmit carrier reflection and focuses solely on minimizing this parameter at the interface of the TMN to the front-end circuitry is a commonly used method of TMN control. Such a closed loop control method generally drives the TMN response to a critically coupled response that is naturally narrowband in nature at the frequency of the detected carrier. A narrowband TMN response centered at the transmit frequency may very likely not provide any improvement in impedance match at the receive frequency and could actually degrade the impedance match at the receive frequency as illustrated in FIG. 2a and described in greater detail below.

Figure 2A:
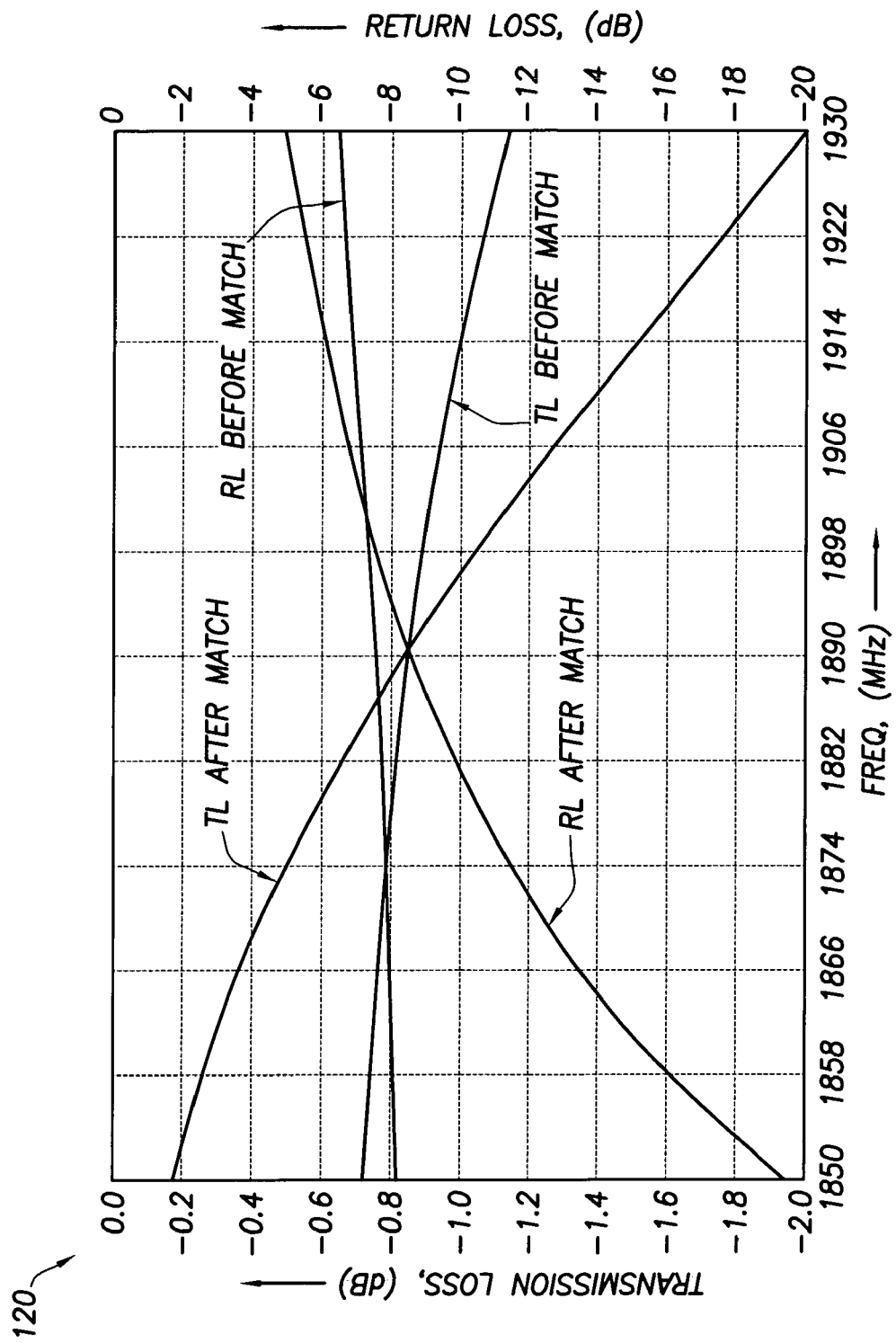
FIG. 2a is a graph illustrating the degradation of the receiving frequency that may occur when impedance matching is performed only with respect to the transmission frequency.

Referring to FIG. 2a, a graph 120 illustrates the result of simulations conducted using common matching circuit topologies and using actual antenna VSWR data. As can be seen in the example of FIG. 2a, tuning the TMN as described above may result in improvement at the transmit carrier frequency while simultaneously degrading the impedance match and resulting transmission loss at the receive frequency. More specifically, the graph 120 illustrates the impact of impedance matching for transmit and receive using an x-axis representing frequency in MHz, a left y-axis representing the transmission loss in decibels, and a right y-axis representing the return loss in decibels. The lines labeled "TL before match" and "TL after match" are referenced to the left hand y-axis and the lines labeled "RL before match" and "RL after match" are referenced to the right hand y-axis. The dB values were taken at frequencies of 1850 MHz and 1930 MHz both before and after matching.

Referring to the "TL before match" line relative to the "TL after match" line at the frequency of 1850 MHz, the graph 120 illustrates how the transmit frequency transmission loss is improved from −0.7 dB to −0.2 dB. In contrast, referring to the "TL before match" line relative to the "TL after match" line at the frequency of 1930 MHz, it can be seen that the transmission loss is degraded from −1.1 dB to −2.0 dB at the corresponding receive frequency of 1930 MHz. Since it is generally desirable to maintain balance between the transmit and receive links in a full duplex wireless network, this improvement of the transmit carrier transmission efficiency at expense of the receive carrier transmission efficiency is usually not desirable.

An alternate method of controlling the TMN 110 described herein may be based on an open control loop method in which the transmit power reflection is detected at the TMN to antenna interface. As will be described below in greater detail, the appropriate TMN settings may be determined by a controller that will provide a broadband matching response based on the detection of the transmit carrier reflection at the antenna interface. The open loop control method can be designed to avoid the critically coupled response that will naturally occur with the closed loop control method, as is illustrated in FIG. 2b.

Figure 2B:
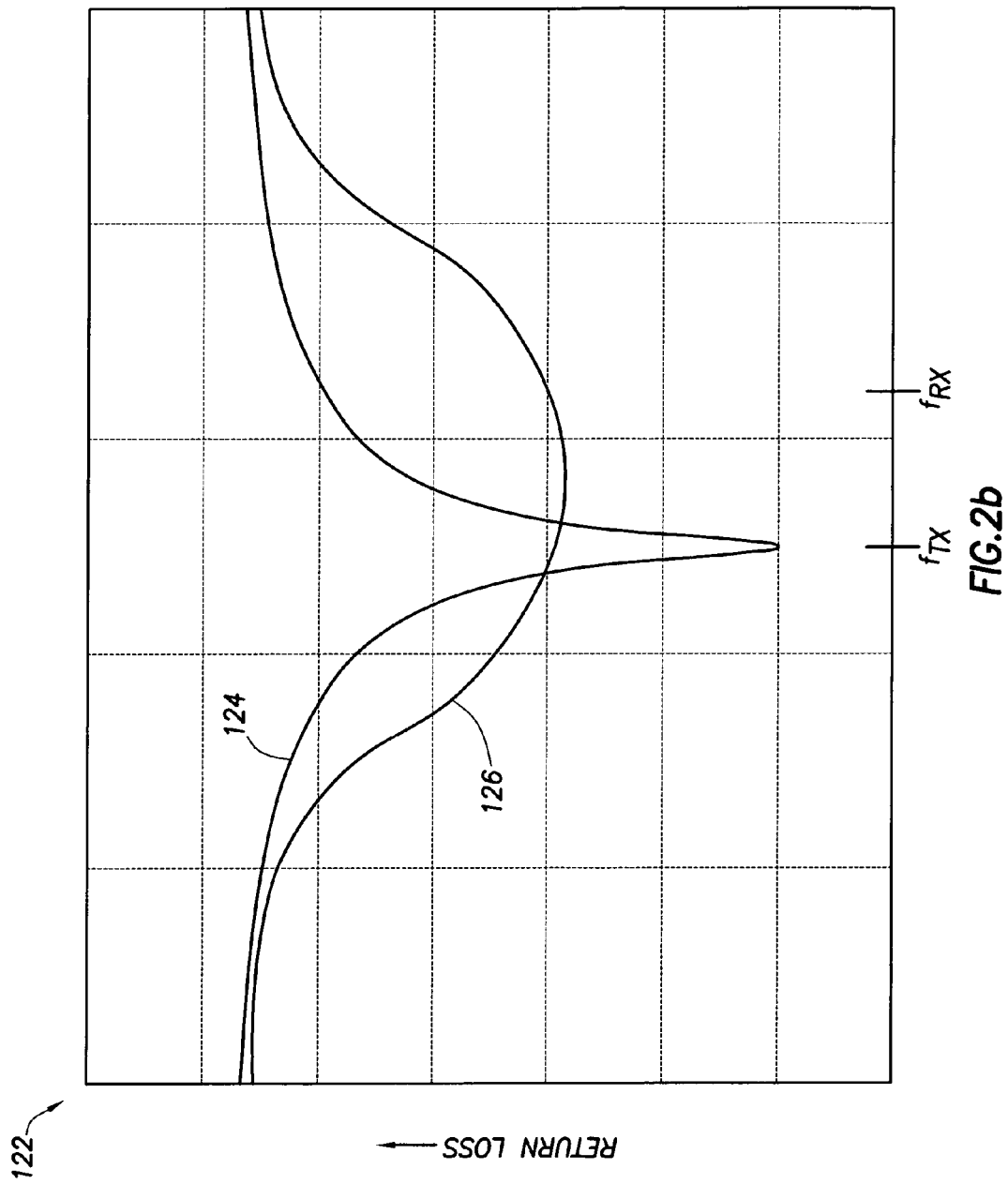
FIG. 2b is a graph illustrating the contrast between a closed loop control method and an open loop control method.

Referring to FIG. 2b, a graph 122 illustrates an example of the wideband response achievable with an open loop control method versus that generally achievable with a closed loop control method. The graph 122 includes a y-axis representing the return loss and an x-axis representing frequency. As discussed previously, the transmit and receive frequencies are offset from one another. As can be seen in FIG. 2b, the closed loop control method provides a critically coupled narrowband response (represented by line 124) at the transmit frequency with poor matching at the receive frequency. The open loop control method provides an over-coupled broadband response (represented by line 126) that covers both the transmit and receive frequencies simultaneously.

Referring again to FIG. 1, a TMN 110 may be used with the system 100 to control impedance matching for both the transmitting and receiving carrier frequencies simultaneously. It is understood that the TMN 110 may be implemented as a single network or as multiple networks, and is presented in the present example as a single network for purposes of illustration only. As will be described below in greater detail, the TMN 110 may include multiple fixed and/or variable elements. In some embodiments, the TMN 100 may be divided into sections that may be switched between two states: ON and OFF. Furthermore, the reactive elements may be related to the other reactive elements in the network based on a predefined relationship. Detailed examples of reactive elements and relationships between such elements, including a network having elements arranged to form a digitally tunable network, are provided in previously incorporated U.S. patent application Ser. No. 11/232,663.

In the present embodiment, the TMN 110 may be capable of impedance matching over a relatively large range of the Smith Chart (e.g., up to a 12:1 VSWR at any phase) using a common matching network topology. The TMN 110 may also be capable of matching transmit and receive frequencies simultaneously at, for example, a 45 to 190 MHz separation with relatively large impedance differences between these frequencies. It is understood that such simultaneous matching may involve a "best" match for both the transmit and receive frequencies, rather than a "perfect" match for a single frequency. By proper setting of the tunable elements of the TMN 110, it is possible to achieve a broadband match instead of a narrowband match as illustrated in FIG. 2b.

The TMN 110 may have tunable element ranges sufficiently large to provide tuning over a wide frequency range (e.g., from about 824 MHz to 2170 MHz for cellular phone applications). It is understood that the frequency range may vary depending on the particular application and may cover other frequency bands. Various elements of the TMN 110, such as inductive elements, may have fixed values. Furthermore, in some embodiments, the number of tunable elements may be minimized to reduce control complexity, and low complexity may be desirable to minimize matching network insertion loss.

Figure 3:
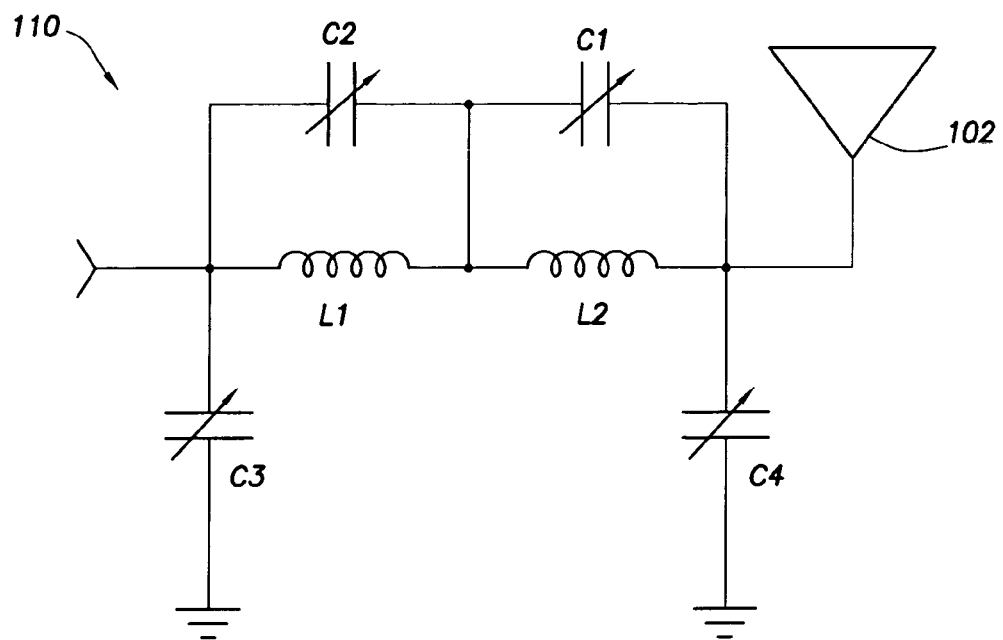
FIG. 3 is a circuit diagram of one embodiment of a tunable matching network that may be used within the system of FIG. 1.

Referring to FIG. 3, one embodiment of a TMN circuit (e.g., all or a portion of the TMN circuit 110 of FIG. 1) is illustrated. As shown, the TMN circuit 110 may be a variant of a pi-network topology that includes the use of multiple reactive series sections, rather than a pi circuit configuration having a capacitor—inductor—capacitor arrangement. Although the TMN circuit 110 is illustrated with two reactive series sections, it is understood that it may include any number of sections. Following each reactive series section, it is understood that a tunable shunt element may be coupled to ground. By incorporating multiple reactive series sections optionally followed by shunt elements to ground, the TMN circuit 110 may provide impedance matching over a broad bandwidth (e.g., more than one octave) without the use of tunable inductors or switch inductor banks.

The TMN circuit 110 includes four tunable capacitors C1, C2, C3, and C4 and two fixed inductors L1 and L2. In the present embodiment, the TMN circuit 110 is able to implement the needed tunable reactive elements using only tunable capacitors or switched capacitor banks. Accordingly, such a circuit may be implemented using tuned or switched microelectromechanical system (MEMS) capacitors or varactors, such as those described in previously incorporated U.S. patent application Ser. No. 11/232,663.

Figure 4:
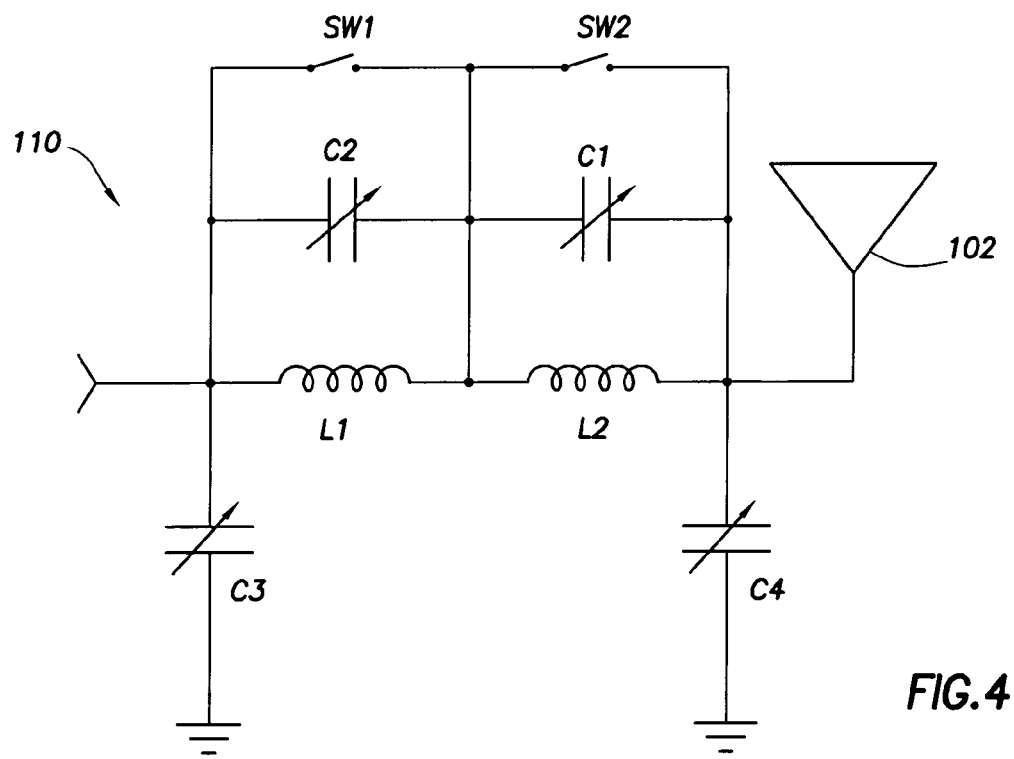
FIG. 4 is a circuit diagram of another embodiment of a tunable matching network that may be used within the system of FIG. 1.

Referring to FIG. 4, another embodiment of a TMN circuit 110 is illustrated. The TMN circuit 110 is similar to the TMN circuit of FIG. 3 with the addition of shunt switches SW1 and SW2. Each shunt switch SW1 and SW2 is associated with a reactive series section and enables a capacitor of the TMN circuit 110 to be bypassed.

Generally, if a TMN circuit is to be implemented with the capability to provide impedance matching over a broad range of the Smith Chart and over a broad frequency range with a common topology, the range of values that may be needed for the tunable capacitor elements may become very large. More specifically, tunable capacitors may not be practical to achieve the desired impedance transformation range (e.g., from about 100 fF to 40 pF) from such a circuit. To address this issue, one or more bypass switches (e.g., MEMS switches) may be used. Such an implementation may reduce the range needed from the variable capacitors from about 100 fF to about 5 pF. Furthermore, the use of such switches may result in lower loss.

Accordingly, the shunt switches SW1 and SW2 may be used to minimize the required tuning range of the TMN circuit 110. Due to the wide bandwidth and broad Smith Chart coverage, some of the TMN circuit 110's elements may be varied from a very low capacitance level to essentially an RF short. By implementing the shunt switches SW1 and SW2 in parallel with the tunable capacitors C1 and C2, respectively, it is possible to bypass one or both of the capacitors in conditions that require a very low RF impedance. Other tunable elements (e.g., C3 and C4) may be adjusted to provide an effective match. Accordingly, the tuning range of a given circuit element may be limited from 100:1 to a range of 10:1, for example, by utilizing the corresponding shunt switch in place of the low impedance states. Although FIG. 4 shows switches in parallel only with C1 and C2, it is understood that switches may be placed in parallel with any of the reactive sections of the TMN 110 to produce the range of element value tuning required.

It is understood that the TMN circuits of FIGS. 3 and 4 are for purposes of example only and that other circuits may be used. For example, circuits may be implemented with multiple sections, with a single shunt switch for multiple sections, with fixed circuit elements (e.g., fixed capacitors), and/or with various combinations of fixed and variable elements, as well as with various relationships among the elements. By further example, each series and shunt reactive stage may contain either a capacitor, an inductor, or an inductor and capacitor either in series or parallel. Between each series reactive stage, use of a shunt reactive element to ground is optional. Furthermore, the circuitry for matching the impedances of the transmit and receive frequencies may be separate or may be implemented as a single circuit.

Referring again to FIG. 1, a controller 112 may be coupled to the TMN 110. It is understood that a single controller may control multiple TMNs or a controller may control a single TMN. Furthermore, a controller may be integrated with a TMN or with another component, or may be a stand alone controller as illustrated. Such controllers may be programmable, enabling the use of a single controller architecture for different types of matching networks, or may be customized for a particular network type (e.g., as an application specific integrated circuit (ASIC)). The controller 112 may contain the capability to obtain the magnitude and/or phase of signal reflections using, for example, VSWR detection means 114. VSWR detection means 114 may detect and measure the magnitude and phase using methods known in the art. The controller 112 may then use these measurements to determine the TMN settings. In addition, a controller may perform various calculations (e.g., to identify which capacitors of a matching network should be set to match a particular impedance) or may simply receive instructions such as ON/OFF from another component and tune the matching network based on those instructions.

In the present embodiment, the controller may use information such as the VSWR phase and magnitude, band and frequency information, and phone state information (e.g., flip-up, flip-down, slide-up, slide-down, idle, and active) to index one or more data structures, such as a look-up table. (For purposes of example, the following description uses a look-up table, but it is understood that the term "look-up table" is used to represent all data structures that may be used and other data structures may be substituted when a look-up table is described). The cells of the look-up table(s) contain the settings of the individual tunable elements of the TMN circuit 110.

In the present example, these settings are pre-determined to provide a broadband impedance transformation based on typical antenna characteristics of the antenna 102 using detection of the antenna transmit VSWR. Generally, while the absolute magnitude and phase of the antenna VSWR at the transmit and receive carrier frequencies can vary widely, the variation in the relative phase and magnitude between the two frequencies may be repeatable for specific frequency conditions. Accordingly, by measuring the antenna VSWR at the transmit frequency, a TMN configuration may be derived that is relatively effective at impedance matching at both frequencies simultaneously (e.g., the configuration may provide a compromise between ideal matching impedances for each frequency). In other words, by determining the transmit carrier antenna VSWR magnitude and phase, operating band and frequency, and phone state, a pre-determined TMN configuration may be identified that will provide an acceptable impedance transformation at both the transmit and receive frequencies simultaneously in an open control loop setting.

Table 1 illustrates one embodiment of a look-up table that may be used by the controller 112 of FIG. 1. As illustrated in Table 1, the controller 112 may use a variety of information to determine the settings of four different variable capacitors C1, C2, C3, and C4. For example, the capacitors C1-C4 may be those illustrated in FIGS. 3 and 4. In the present example, the phone is a clamshell phone that has open and closed modes, and operates in the E-GSM TX band at 880 MHz (channel #955) and 915 MHz (channel #124). The RX side has the same channel number but is frequency shifted by 45 MHz.

TABLE 1

| Flip State | Band | Frequency Channel | TX Return Loss Magnitude (dB) | TX Return Loss Phase (°) | C1 (pF) | C2 (pF) | C3 (pF) | C4 (pF) |
|---|---|---|---|---|---|---|---|---|
| DOWN | E Cell | 955 | −2.1 | 113 | By Pass | By Pass | 2.1 | 2.3 |
| DOWN | E Cell | 124 | −4.8 | 90 | By Pass | By Pass | 0.8 | 2.1 |
| DOWN | E Cell | 955 | −7.1 | 133 | By Pass | By Pass | 2.6 | 1.6 |
| DOWN | E Cell | 124 | −6.9 | 141 | By Pass | By Pass | 1.5 | 2.9 |
| UP | E Cell | 955 | −5.5 | 134 | By Pass | 0.1 | 1.1 | 3.6 |
| UP | E Cell | 124 | −5.3 | 137 | By Pass | 0.1 | 1.6 | 3.6 |
| UP | E Cell | 955 | −5.9 | 164 | 0.1 | By Pass | 3.5 | 4 |
| UP | E Cell | 124 | −4.5 | 154 | By Pass | 2.4 | 4 | 2.8 |

The information used by the controller 112 may include a flip state that identifies whether the phone is open or closed, the band, the frequency channel, and the TX return loss magnitude and phase. Based on this information, the controller identifies the settings for the capacitors C1-C4. For example, assume that the flip state is DOWN, the band is E Cell, and the frequency channel is 955. Also assume that the TX return loss magnitude is −2.1 dB and the phase is 113 degrees. Accordingly, using the circuit of FIG. 4 as an example, the controller may set the shunt switches SW1 and SW2 to bypass C1 and C2, respectively, and set C3 at 2.1 pF and C4 at 2.3 pF. As the settings for C1-C4 have been optimized for both transmit and receive impedance matching under the stated conditions, the controller may simply apply these settings to the TMN circuit 110. In some embodiments, the controller 112 may perform dynamic calculations to identify the settings.

It is understood that some values, such as the transmit return loss magnitude, may be used as part of a range. For example, all values falling within 0.1 dB of the −2.1 dB value may default to the settings associated with the −2.1 dB value. Therefore, the number of configurations stored for the TMN 110 may be customized by increasing or decreasing the deviation of acceptable ranges.

Accordingly, the controller 112 may use predefined configurations to tune one or more elements of the TMN network based on the antenna response at both the transmit and receive frequencies. It is understood that the settings stored in the look-up table may be determined in different ways, such as through simulation or experimentation. The settings may be stored in non-volatile memory 116.

In some embodiments, the controller 112 may be implemented in firmware with an existing microprocessor (e.g., a terminal processor) in the phone. For example, the controller 112 needs information on the phone state, operating band, frequency, and phone state, and the terminal processor may already have access to such information. Furthermore, the terminal processor may also have access to non-volatile memory, so the look-up table(s) may be stored in this memory. However, it is understood that other embodiments may be used where, for example, the controller 112 and/or memory 116 are separate from the terminal processor. In still other embodiments, configurations may be downloaded from a network and stored in the memory 116 or used dynamically after downloading.

Figure 5:
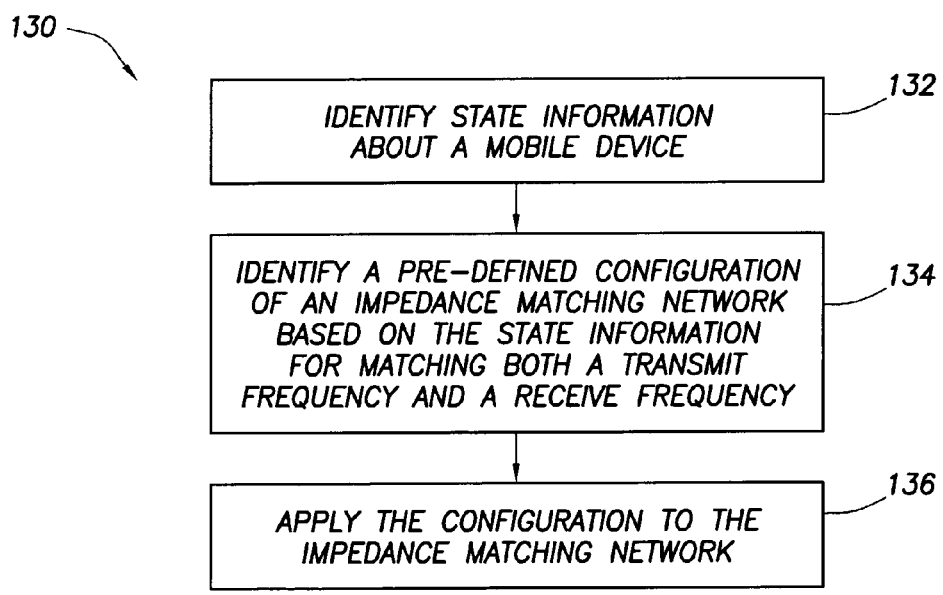
FIG. 5 is a flowchart of a method that may be executed within the system of FIG. 1 for impedance matching.

Referring to FIG. 5, in one embodiment, a method 130 may be used to set a TMN in a mobile device, such as the TMN 110 of FIG. 1. For example, the method 130 may be executed by the controller 112 as a series of instructions. In step 132, the method 130 identifies state information about the mobile device. Using row 1 of Table 1 as an example, step 132 would identify the flip state as DOWN, the band as E Cell, the frequency channel as 955, and the TX return loss magnitude and phase as −2.1 dB and 113 degrees, respectively.

In step 134, a memory (e.g., the memory 116 of FIG. 1) may be accessed to identify a configuration of the TMN 110 based on the state information. Continuing the example using row 1 of Table 1 (and the TMN circuit 110 of FIG. 4), the configuration identifies that shunt switches SW1 and SW2 are to be set to bypass C1 and C2, respectively, and that capacitors C3 and C4 are to be set to 2.1 pF and 2.3 pF, respectively. Accordingly, step 134 enables the method 130 to select a configuration that includes values for simultaneously matching an impedance of both a transmit frequency and a receive frequency with an impedance of the antenna. In step 136, the values are applied to the elements of the TMN 110.

Although the present disclosure is described in terms of an open-loop architecture, a closed loop architecture may be implemented in some embodiments. It is understood that a closed loop architecture may require various modifications in terms of the methodology used to control such an architecture.

Although only a few exemplary embodiments of this disclosure have been described in details above, those skilled in the art will readily appreciate that many modifications are possible in the exemplary embodiments without materially departing from the novel teachings and advantages of this disclosure. Also, features illustrated and discussed above with respect to some embodiments can be combined with features illustrated and discussed above with respect to other embodiments. Accordingly, all such modifications are intended to be included within the scope of this disclosure.

What is claimed is:

1. A system for impedance matching in a wireless device, comprising:
   signaling circuitry coupled to an antenna and configured to receive a signal at a first frequency and transmit a signal at a second frequency;
   impedance matching circuitry coupled to the signaling circuitry and having a plurality of tunable elements for matching an impedance of the first and second frequencies with an impedance of the antenna;
   a memory containing a plurality of values associated with the tunable elements, wherein each value corresponds to a state of the signaling circuitry and is defined to configure the associated tunable element for impedance matching at both the first and second frequencies when the signaling circuitry is in the corresponding state; and
   a controller configured to obtain a current state of the signaling circuitry and a current state of a physical property of the wireless device, select the values from the memory that correspond to the current states of the signaling circuitry and the physical property of the wireless device, and apply the selected values to their associated tunable elements, wherein the current state of the signaling circuitry comprises a transmit return loss magnitude and phase.

2. The system of claim 1 further comprising a terminal processor, wherein the controller is integrated with the terminal processor.

3. The system of claim 1, wherein the current state of the physical property of the wireless device is one of: clamshell open, clamshell closed, slider open, and slider closed.

4. The system of claim 1 wherein the plurality of values are organized as a data structure.

5. The system of claim 4 wherein the data structure is a look-up table with an index based on the current state of the signaling circuitry and wherein the current state includes an antenna voltage standing wave ratio (VSWR) magnitude and phase.

6. The system of claim 5 wherein the look up table is further indexed based on a frequency band.

7. The system of claim 6 wherein the look up table is further indexed based on a frequency channel.

8. The system of claim 1 wherein the impedance matching circuitry includes a plurality of reactive series sections.

9. The system of claim 8 wherein the impedance matching circuitry can be configured to bypass at least one of the plurality of reactive series sections.

10. The system of claim 8 wherein the impedance matching circuitry is divided into a plurality of shunt sections and wherein the impedance matching circuitry can be configured to bypass at least one of the plurality of shunt sections.

11. A circuit for use in a tunable matching network in a wireless device, comprising:
    a first reactive series section coupled to an input line, the first reactive series section having a first variable capacitor and a first fixed inductor coupled in parallel to the first variable capacitor;
    a second reactive series section coupled to an antenna via an output line and coupled in series to the first reactive series section, the second reactive series section having a second variable capacitor and a second fixed inductor coupled in parallel to the second variable capacitor;
    a third variable capacitor coupled between ground and the input line and first reactive series section; and
    a fourth variable capacitor coupled between ground and the output line and second reactive series section,
    wherein the capacitance value of each of the variable capacitors is determined according to a transmit return loss magnitude and phase of a signaling circuitry and a current state of a physical property of the wireless device.

12. The circuit of claim 11 further comprising a shunt switch positioned in parallel with one of the first or second variable capacitors to bypass the first or second reactive series section when actuated.

13. The circuit of claim 11 wherein the capacitance value of each of the variable capacitors is determined according to a flip state of a mobile flip phone.

14. The circuit of claim 11, wherein the current state of the physical property of the wireless device is one of: clamshell open, clamshell closed, slider open, and slider closed.

15. The circuit of claim 11 further comprising a first shunt switch positioned in parallel with the first variable capacitor and a second shunt switch positioned in parallel with the second variable capacitor, wherein the first and second shunt switches bypass the first and second reactive series section, respectively, when actuated.

16. The circuit of claim 15 wherein the first and second capacitors and first and second shunt switches are microelectromechanical system (MEMS) devices.

17. A mobile device for use in a wireless network, the mobile device comprising:
signaling circuitry coupled to an antenna;
an impedance matching network coupled to the signaling circuitry;
a controller configured to obtain a current state of the signaling circuitry; and
a memory containing a look-up table for use by the controller in setting the impedance matching network in the mobile device, the look-up table comprising:
an index having values associated with a plurality of mobile device states and a plurality of states of a physical property of the mobile device; and
a plurality of configurations, each configuration associated with a particular mobile device state and a particular state of the physical property of the mobile device, and containing predefined values for setting a plurality of tunable elements of the impedance matching network to simultaneously match a first frequency and a second frequency, wherein the plurality of mobile device states comprise a transmit return loss magnitude and phase.

18. The mobile device of claim 17 wherein the plurality of mobile device states include an antenna voltage standing wave ratio (VSWR) magnitude.

19. The mobile device of claim 17 wherein the plurality of mobile device states include an antenna voltage standing wave ratio (VSWR) phase.

20. The mobile device of claim 17 wherein the plurality of mobile device states include a frequency band.

21. The mobile device of claim 17 wherein the plurality of mobile device states include a frequency channel.

22. The mobile device of claim 17 wherein the predefined values for the tunable elements comprise a setting for a variable capacitor.

23. The mobile device of claim 17 wherein the predefined values for the tunable elements comprise a setting for a shunt switch.

24. The method of claim 17 wherein the plurality of states of the physical property of the wireless device comprise clamshell open, clamshell closed, slider open, and slider closed.

25. A system for impedance matching in a wireless device, comprising:
signaling circuitry coupled to an antenna and configured to receive a signal at a first frequency and transmit a signal at a second frequency;
impedance matching circuitry coupled to the signaling circuitry and having a plurality of tunable elements for matching an impedance of the first and second frequencies with an impedance of the antenna;
a memory containing a plurality of values associated with the tunable elements, wherein each value corresponds to a state of the signaling circuitry and is defined to configure the associated tunable element for impedance matching at both the first and second frequencies when the signaling circuitry is in the corresponding state; and
a controller configured to obtain a current state of the signaling circuitry and determine whether the wireless device is open or closed, select the values from the memory that correspond to the current state of the signaling circuitry and the determination of whether the wireless device is open or closed, and apply the selected values to their associated tunable elements, wherein the current state of the signaling circuitry comprises a transmit return loss magnitude and phase.

26. The system of claim 25 wherein the impedance matching circuitry includes a plurality of reactive series sections.

* * * * *